United States Patent
Onishi

(10) Patent No.: US 8,597,473 B1
(45) Date of Patent: Dec. 3, 2013

(54) REACTIVE PHYSICAL VAPOR DEPOSITION WITH SEQUENTIAL REACTIVE GAS INJECTION

(75) Inventor: Shinzo Onishi, Seminole, FL (US)

(73) Assignee: University of South Florida, Tampa, FL (US)

(*) Notice: Subject to any disclaimer, the term of this patent is extended or adjusted under 35 U.S.C. 154(b) by 1424 days.

(21) Appl. No.: 11/161,976

(22) Filed: Aug. 24, 2005

Related U.S. Application Data

(63) Continuation of application No. PCT/US2004/005398, filed on Feb. 23, 2004.

(60) Provisional application No. 60/319,967, filed on Feb. 24, 2003.

(51) Int. Cl.
  *C23C 14/00* (2006.01)
  *C23C 14/32* (2006.01)
  *C25B 9/00* (2006.01)
  *C25B 11/00* (2006.01)
  *C25B 13/00* (2006.01)

(52) U.S. Cl.
  USPC ............ 204/192.13; 204/192.12; 204/192.15; 204/298.07

(58) Field of Classification Search
  USPC ............. 204/192.12, 192.13, 298.07, 192.15; 438/653
  See application file for complete search history.

(56) References Cited

U.S. PATENT DOCUMENTS

| | | | | |
|---|---|---|---|---|
| 4,428,811 A * | 1/1984 | Sproul et al. | ............ | 204/192.13 |
| 5,126,028 A * | 6/1992 | Hurwitt et al. | ............ | 204/192.13 |
| 5,439,574 A * | 8/1995 | Kobayashi et al. | ...... | 204/192.12 |
| 5,942,089 A * | 8/1999 | Sproul et al. | ............ | 204/192.13 |
| 6,080,665 A * | 6/2000 | Chen et al. | .................... | 438/653 |
| 6,207,027 B1 | 3/2001 | Ngan | | |
| 6,217,720 B1 * | 4/2001 | Sullivan et al. | .......... | 204/192.13 |
| 6,296,747 B1 * | 10/2001 | Tanaka | ..................... | 204/298.07 |
| 6,458,253 B2 * | 10/2002 | Ando et al. | ............. | 204/192.15 |
| 6,537,428 B1 * | 3/2003 | Xiong et al. | ............. | 204/192.13 |
| 6,572,738 B1 | 6/2003 | Zueger | | |
| 2002/0195332 A1 * | 12/2002 | Burton et al. | ............ | 204/192.13 |

* cited by examiner

*Primary Examiner* — Michael Band
(74) *Attorney, Agent, or Firm* — Michele L. Lawson; Robert J. Varkonyi; Smith & Hopen, P.A.

(57) ABSTRACT

The present invention provides a method of controlling a reactive sputtering system used in coating processes. More specifically, the present invention provides a microprocessor-based control system for reactive gases in a sputtering system, particularly during the start-up phase of operation. The preferred demand for such a reactive gas is predicted for every stage of the operation, and the reactive gas supply is amenable to predictive control provided by object program-driven mathematical formulae. The injection of reactive gas using time-advanced, sequential, mathematically-derived procedures simplifies overall system operation and provides a system with an optimal amount of reactive gas at an optimal time.

7 Claims, 5 Drawing Sheets

REACTIVE PHYSICAL VAPOR DEPOSITION WITH SEQUENTIAL REACTIVE GAS INJECTION

CROSS REFERENCE TO RELATED APPLICATIONS

This application is a continuation of International Application No. PCT/US04/05398, filed on Feb. 23, 2004, which claims the benefit of U.S. Provisional Patent Application Ser. No. 60/319,967 filed Feb. 24, 2003.

FIELD OF THE INVENTION

The present invention relates generally to systems and methods for physical and chemical vapor deposition, and relates more specifically to systems and methods for controlling a reactive vapor deposition sputtering system used in coating processes.

BACKGROUND OF THE INVENTION

Sputtering is a method of physical vapor deposition (PVD) that involves the removal of material from a solid cathode by bombarding it with positive ions from the discharge of a rare and inert gas such as argon (Ar). The cathode is generally made from a metal or an insulator and, in contrast to thermal evaporation; complex compounds such as high-temperature superconductor (HTS) materials can be sputtered with less chemical composition change. Sputtering is often done in the presence of a reactive gas, such as oxygen and nitrogen, to control or modify the properties of the deposited film.

Although reactive PVD provides a higher deposition rate and generally higher quality films, there are fundamental problems such as non-linear operating parameters and difficulty in providing long-lasting effective electrodes. The specific interrelated problems associated with reactive PVD include: 1) cathode poisoning and anode/ground disappearing, 2) initiation, and 3) shutter control.

The reactive PVD system has two distinguishable stable modes in operation: a poison mode and a non-poison mode. The poison mode occurs when the target becomes fouled by oxide or nitride formation, thus losing its metallic nature. In contrast, the non-poison mode, in addition to normal deposition of dielectric on the substrate, may also be affected by the amount of metal surface left on the target with the result of low dielectric formation.

In order to maintain proper sputtering conditions in the system, it is critical to carefully control the amount of reactive gas in the system, especially in the start-up phase of operation. If an excess of reactive gas is introduced into the system, the target is likely to become fouled and undergo a chemical reaction on its surface, with the result that the desired deposition rate may become low. On the other hand, excess reactive gas at any moment may result in cathode poisoning, anode/cathode disappearing, and/or possible pulling in of the wrong operating mode. In addition, because a dielectric film covers the surface of the target, it is frequently broken by arc discharges. If the system is not supplied with enough reactive gas, then the films produced on the substrate may be low in reactive gas or have reactive gas vacancies. This short supply of reactive gas may result in reactive molecule vacancy in the deposited film. Thus, the control of reactive gas injection is an important factor in achieving desired system performance. In addition, the voltage and current properties are critical, since because they affect the rate of ion formation at the target site.

Therefore, it is desirable to provide a sputtering system with gas flow regulation of a reactive gas to achieve the desired properties of the deposited film. It is also desirable to provide a sputtering system that reduces the need for system cleaning, minimizes poisoning of the system target or anode/ground disappearance, and provides simpler operation than existing coating technologies.

SUMMARY OF THE INVENTION

The present invention provides a method of controlling a reactive sputtering deposition system used in coating processes. More specifically, the present invention provides a control system for the reactive gases in a sputtering system during the critical start-up phase of operation. The demand for reactive gas is very predictable in every state of the operation of the sputtering system, and, according to the present invention, this prediction may be regulated by use of a start-up program, such as one regulated by a mathematical algorithm to enhance the operating parameters. Injecting reactive gas with time-advanced sequential, mathematical procedures simplifies the overall system operation and the system receives the correct amount of reactive gas at the correct time. Thus, cathode poisoning and anode/ground disappearance are minimized and a sputtering system is thus provided that allows prolonged, continuous operation with reduced need for cleaning. The present invention makes it possible to start deposition with reduced need for a shutter, which may otherwise release particles and make the operation more complex.

In a preferred embodiment of the present invention, a system is provided for performing sputter deposition on a substrate. The system comprises a chamber defined by a housing, the housing containing a target, a substrate, a gas evacuator and a gas introducer. A gas flow regulator is in fluid communication with the gas introducer and regulates the flow of reactive and inert gas into the chamber. A power supply provides power to the target. An introduction controller coordinates the operation of the power supply and the gas flow regulator according to a desired program.

According to an additional embodiment, the desired program denotes a time-based sequence for coordinating the gas flow regulator and the power supply.

In yet another embodiment, the desired program bases operation of the gas regulator to regulate the flow of reactive gas according to a time variable.

In another embodiment, the desired program separately addresses the initiation of function of the gas flow regulators and the power supply as time dependent.

According to another embodiment, the system for performing sputter deposition on a substrate comprises a chamber, the chamber containing a sputtering target, a gas evacuator, a reactive gas introducer and an inert gas introducer. A power supply is connected to the chamber to supply electrical current to the target. An introduction controller is attached to the reactive gas introducer and the inert gas introducer. The introduction controller is responsive to a signal produced by a system controller. The system controller is responsive to a pre-set program of operation, wherein the pre-set program operates the system according to a pre-set time interval.

In another embodiment, the pre-set time intervals define start-up of the introduction controller, the system controller and the power supply as independent functions dependent upon time.

In a preferred method of operating a sputtering system provided by the present invention, a substrate and a target are positioned within a sputtering chamber, a control signal is generated to evacuate the ambient gas from the chamber, the chamber is filled with inert gas via a gas controller, a current flow is generated across said the target, and reactive gas is introduced via a gas controller to the chamber, whereby the reactive gas is introduced as a predetermined time in the sequence of operation of the inert gas controller and the power supply.

In yet another preferred method embodiment, a system controller is used to initiate evacuation of the chamber, the power supply and the gas controller, the system controller generating responses based on time sequences.

In an additional preferred method embodiment, the system controller functions in response to a pre-determined program that initiates events based on time delay.

In an additional preferred method embodiment, an exhaust controller is used to regulate a total pressure in the reactive chamber.

DETAILED DESCRIPTION OF THE INVENTION

In an exemplary embodiment according to the present invention, a sputtering system for performing sputter deposition is provided with a reaction chamber, a target contained within the reaction chamber, a substrate contained within the reaction chamber, one or more gas flow introducers in fluid communication with the reaction chamber; one or more gas flow regulators controlling the flow of gas through the gas flow introducers, one or more gas evacuators in fluid communication with the reaction chamber, one or more power supplies, and a system controller employing one or more programs to control operations of the gas introducers, gas flow regulators, gas evacuators, and power supplies.

Another exemplary embodiment according to the present invention provides a method for performing sputter deposition of a substrate on a target, in which both target and substrate are positioned within a reaction chamber, a control signal is generated to evacuate ambient gas from the chamber, the chamber is filled with inert gas using a gas controller and an exhaust controller, a current flow is generated across the target, and a reactive gas is introduced to the chamber using a gas controller at a predetermined time in a sequence of operation of the inert gas controller and a system power supply.

Yet another exemplary embodiment according to the present invention provides a method for performing sputter deposition by positioning a substrate and a target within a sputtering chamber, generating a control signal from a system controller based on pre-determined time sequences, evacuating ambient gas from the chamber using a gas evacuator responsive to the system controller, filling the chamber with non-reactive gas using a non-reactive gas controller responsive to the system controller, generating a current flow across the target from power supply responsive to the system controller, and introducing a reactive gas to the chamber using a reactive gas controller responsive to the system controller.

Figure 1:
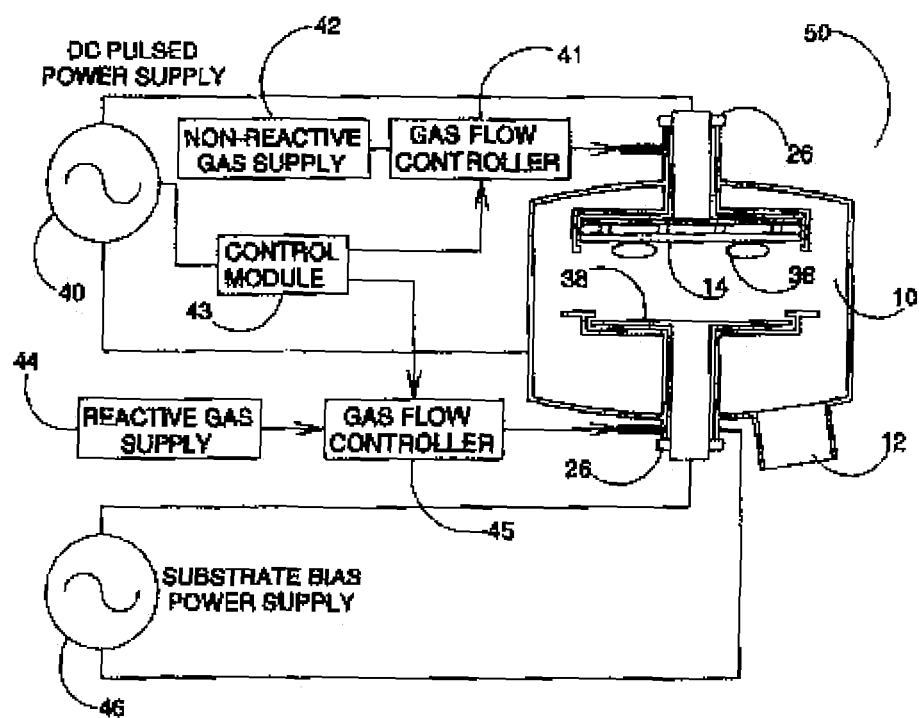
FIG. 1 is a schematic of a sputtering system according to the present invention.

Referring now to the drawings, in which like numerals indicate like elements throughout the several views, an embodiment of a sputtering system according to the present invention is shown as a schematic in FIG. 1. System 50 includes reaction chamber 10, having target 14, power source 40, gas suppliers 42 and 44, and corresponding gas flow regulators 41 and 45. An optional substrate bias power supply 46 is also shown. Power supply 46 may be used for adjusting the characteristics of the substrate during processing as known to one of ordinary skill in the art. System control means 43 is connected to power supply 40 and gas flow regulators 41 and 45.

Figure 2:
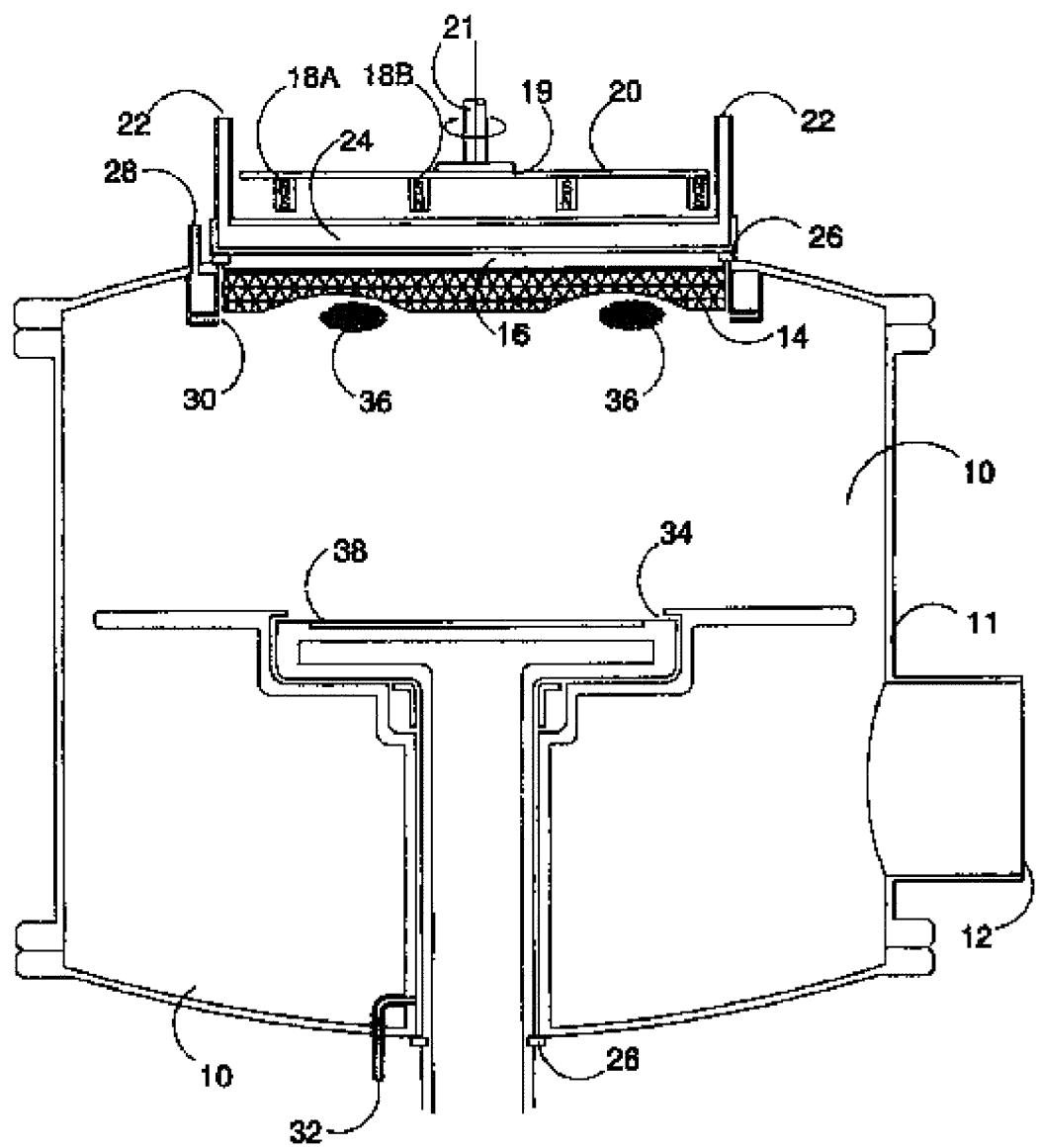
FIG. 2 is a detailed illustration of a reaction chamber of a sputtering system according to the present invention.

FIG. 2. represents a reaction chamber according to the present invention and is a standard system employed by those of ordinary skill in the art. Chamber 10 comprises outer wall 11 enclosing a target 14 and substrate 38. Sputtering chamber 10 is connected to a conventional vacuum pumping system (not shown) via port 12. Target 14, which is comprised of metal or any other materials known to those of skill in the art, is removably affixed to housing 11 by backing plate 16. Conventional water jacket 24 located on the opposite side of backing plate 16 allows water to be conveyed to system 10 via water inlet/outlet ports 22. The operation of water jacket 24 is considered as conventional and known to those of skill in the art.

The magnetic array of an embodiment of a system according to the present invention is depicted as magnetic system 19 and is preferably located above water jacket 24. Magnetic system 19 comprises magnets 18A (outer magnet array), 18B (inner magnet array), affixed to backing plate 20. In operation, magnetic system 19 may be rotated by rotation means 21. Magnetic system 19 serves to enhance operation by providing rotation or non-rotating magnetic fields on target 14. These magnetic fields serve to confine plasma 36 on target 14.

Gases are fed into chamber 10 via gas ports 28 and 32. Non-reactive sputtering gas supply 28 communicates with chamber 110 via injection hole 30 located proximal to target 14. Reactive gas supply 32 enters the chamber 10 at reactive gas gap 34, located proximal to substrate 38. The quantities of gas are regulated by gas control means 41 and 45, shown in FIG. 1; these may comprise valve systems or any other control vehicles as known to those of ordinary skill in the art.

Referring again to the exemplary embodiment according to the present invention shown in FIG. 1, sputtering system 50 is controlled by means of control module 43. Control module 43 may be any conventional control means, as known to those of ordinary skill in the art; however, in a preferred embodiment, control module 43 comprises a personal computer or other microprocessor-based control means. This control module 43 serves to supply the power commands to the power supply as well as affect the time-delayed commands to reactive gas controller 45 according to an object program or mathematical algorithm. Control module 43 can be reversed to achieve the same principles or effects. DC pulsed power may be adjusted according to the reactive gas flow rate.

In operation, sputtering system 50 responds to a series of controls. When the power is initiated in control means 43, the non-reactive gas supply 42, contained in the appropriate control lines, is activated followed by power supply 40. A signal is also sent to reactive gas supply controller 45, which responds by initiating a timed response predetermined by the charts shown in FIG. 3. The consumption of reactive gas is proportional to the input power, so the system instantly links the power level to reactive gas supply 44. Because the amount of power per unit of time is known for power supply system

Figure 4:
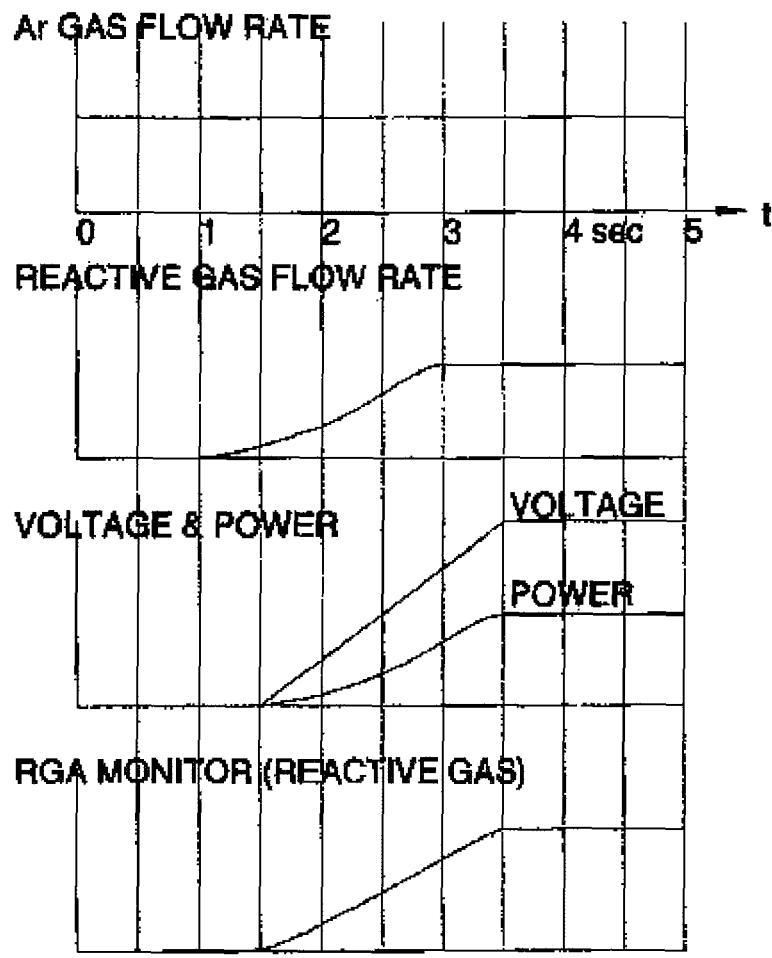
FIG. 4 shows the relationship of time to reactive gas delivery to the reaction chamber.

40, a relationship between power level and time is easily established, generating a time response gradient. In addition, the gas flow rate in a preferred embodiment is maintained as approximately 20 sccm for both gas flow rates. This time response serves to initiate the gas flow from reactive gas supply 44 which is increased over time as shown in FIG. 4. In this way, the reactive gas quantity present in chamber 10 is controlled and deleterious effects of excess reactive gas are obviated. By having the reactive gas supplied to the system based on a time-delay, no feedback mechanism or parameter monitoring is necessary during the start-up phase.

Coordination, analysis, and control reactions to the signals and monitored or input variable factors (including, but not limited to, pulsed power levels, injection placement of oxygen and argon injections, strength of magnetic fields on the target, total gas pressure in the chamber, substrate temperature and condition of the target) are managed by control means 43 under the control of an object program. The object program assesses the appropriate variables and conditions, and performs one or more mathematical formulae to determine and then control optimal gas flow and timing functions.

Figure 3:
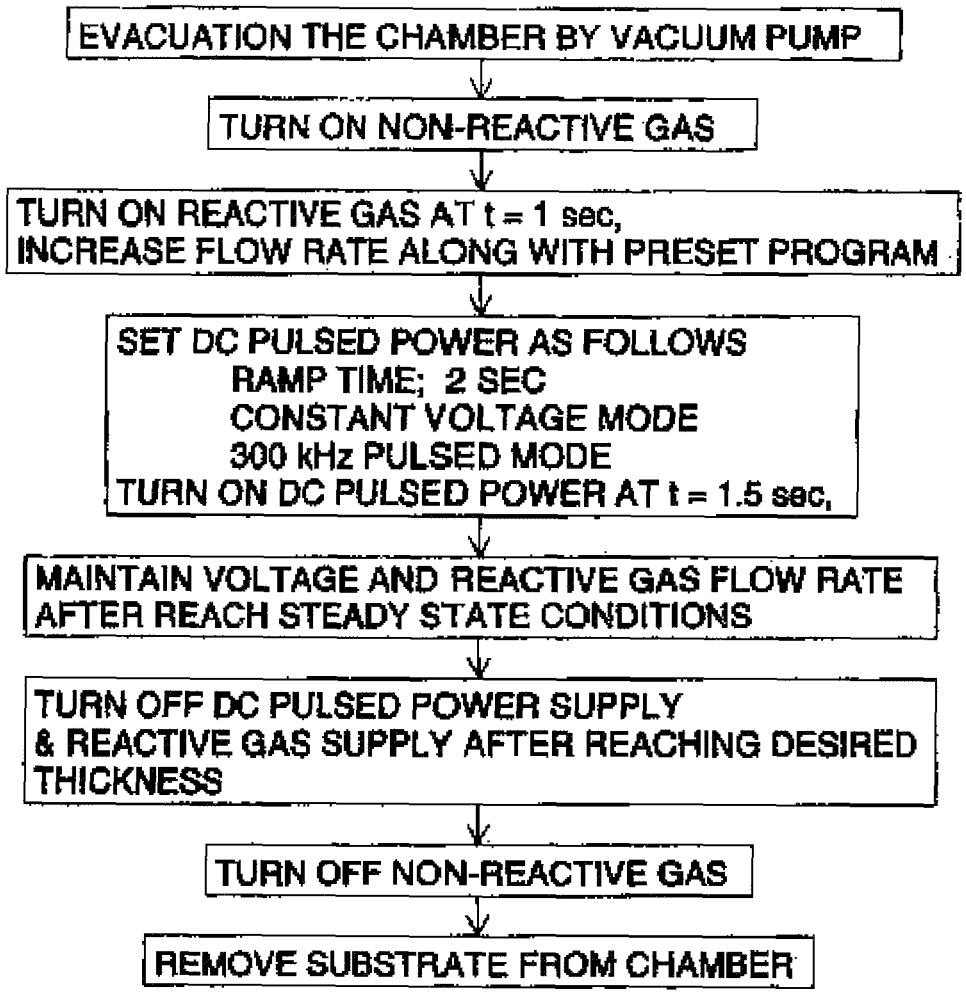
FIG. 3 shows the time-delay settings with respect to the initiation of non-reactive gas injection and pulsed power being delivered to the system.

The ramp times as shown in FIG. 3 illustrate the parameters for a system having a volume of approximately 120 Liters. It is apparent that the time differential will vary according to the size of the chamber used and also the voltage applied. This may be varied by one of ordinary skill in the art and does not cause undue experimentation to the skilled artisan. In addition, with a gas flow differing from 20 sccm the ramp time would increase due to differences in gas flow rates. The gas flow initially into the system is not 20 sccm and the lag time thus takes into consideration this time differential for the optimal gas quantity to be introduced into the system.

Because the reactive gas flow is not a function of a pre-set group of parameters and not condition responsive, control is based on time and not on sensor systems or other elaborate control means, thus making the system less complicated but at the same time efficient and accurate. Because the sequence of reactions in the system is a function of known responses to set parameters, the system does not have the possibility of being poisoned during the start-up functions. Optional feedback mechanisms may be employed to monitor and respond to conditions after start-up, but a system according to the present invention does not require extra controls for operation.

Even though the invention has been described for use in a PVD sputtering system, the concept of time adjusted reactive gas introduction applies to sputtering systems as a whole.

In an exemplary system for sputter deposition according to the present invention, the optimum supply of oxygen is dependant on the system configurations, such as pulsed power levels, injection placement of oxygen and argon injections, strength of magnetic fields on the target, total gas pressure in the chamber, substrate temperature and condition of the target, which can be routinely determined and modified by a skilled artisan.

Further, in an exemplary system for sputter deposition according to the present invention, the practical adjustment of oxygen levels is achieved by sequential pre-determined injection schedule even including a ramp-up starting. The majority of supplied oxygen into the reactive chamber reacts with aluminum and forms aluminum oxide as shown in FIG. 1.

In such an exemplary system for sputter deposition according to the present invention, all of the system parameters may be linked together. When one parameter is changed, all others may be affected as a system. Such parameters include pumping speed, oxygen consumption, DC pulsed power, deposition rates, uniformity, argon flow rates, and chamber pressure. However, after the system configurations are established, the major variable parameter will be the DC pulsed power level, argon flow rates, and chamber pressure.

Moreover, in at least one exemplary embodiment according to the present invention, a process controls a data processor of known type to operate a system for sputter deposition, in which the data processor is disposed to execute an object program comprising one or more mathematical formulae, said process comprising the steps of: examining each of one or more formulae in a storage area of said processor to determine how such formula or formulae can be designated as defined; executing said formula or formulae in the sequence in which the formula or formulae is designated as defined by said object program; re-executing or executing one or more additional formulae in response to signals from one or more monitored factors during sputter deposition; and generating one or more signals from said data processor to modify timing and/or quantity of gas flow, gas evacuation, electrical power applied, or other physical or chemical factors required for sputter deposition.

EXAMPLE

Figure 5:
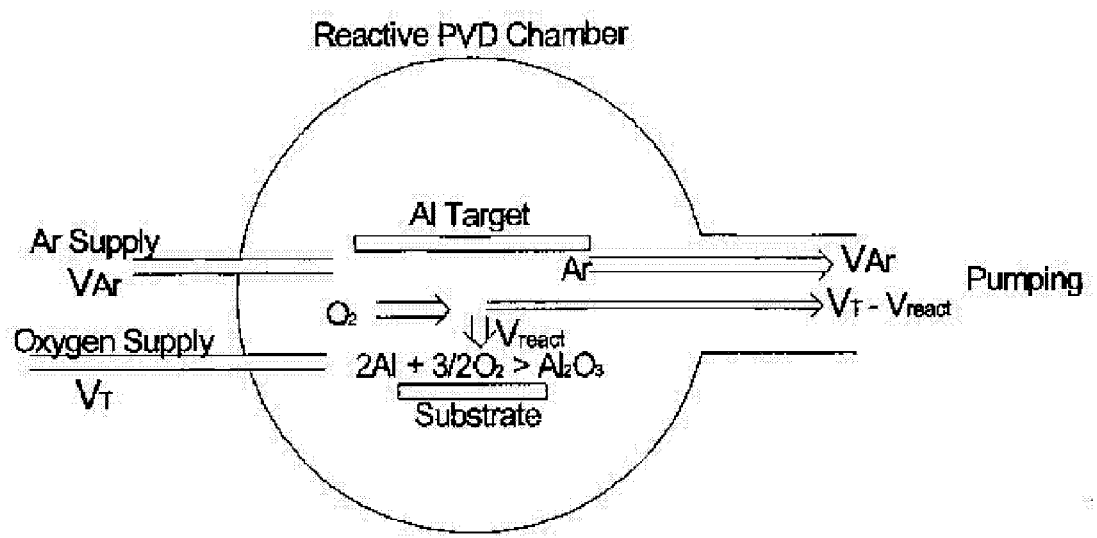
FIG. 5 shows a flow chart of an exemplary sputtering system according to the present invention employing oxygen as the reactive gas.

A flow chart showing a preferred reactive gas supply for reactive sputtering depositions in which oxygen is used as the reactive gas is provided in FIG. 5.

The sequential control requires relations between the amounts of the reactive gas flow rate and optimum DC pulsed power level. Since the target removal rate "m" depends on ion species, adjustment is established using the standard Ar sputtering rates. The material removal rate of mixed gas σ is also a function of reactive and non-reactive gas ratio.

$\sigma = m_{Al(Ar+O2)}/m_{Al(Ar)}$: Ratios reactive vs. non-reactive sputtering rates, where: $m_{Al(Ar+O2)}$ is Al target sputtering rate per power [g/(min·power)] using reactive gas (Ar+O2) and $m_{Al(Ar)}$ is Al target sputtering rate per power [g/(min·power)] using sputtering gas (Ar).

$\sigma \cdot m_{Al(Ar)} \cdot P$: Al sputtering rate using reactive gas (Ar+O2)

For the case in which an aluminum target is sputtered and reacts with oxygen gas to form aluminum oxide, the exemplary chemical reaction is: 2 mols or 54 grams of aluminum react with 1.5 mols or 33.6 liters of oxygen and 1 mol of $Al_2O_3$ will be formed.

$$2Al + 3/2 O_2 \rightarrow Al_2O_3$$

54 g=2 mol·27 g/mol 3/2 mol·22.4 L/mol·1000 cm³/L where 54 g is the molecular weight of 2 moles of the sputtering target, in this example aluminum; 3/2 moles is the molar ratio of the reactive gas, in this example oxygen; 22.4 is the molar volume of reactive gas at standard temperature and pressure (STP), in this example oxygen; and 1000 is a conversion factor used to convert liters to cm³.

The required volume of the oxygen $V_{react}$ is established using the proportional relation.

$$V_{react} = 3/2 \cdot 22.4 \cdot 1000 \cdot \sigma \cdot m_{Al(Ar)} \cdot P/54$$

In the example above: 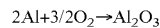$V_{react} = 622 \cdot \sigma \cdot m \cdot P$
where σ is the ratio of the reactive vs. nonreactive sputtering rates; m is the target sputtering rate per power; and P is pressure.

However, actual operation of the PVD system may need more than exact, $V_{react}$.

Required reactive gas supply $V_T = 622 \sigma \cdot m_{Al(Ar)} \cdot (1+EX) \cdot P$ [sccm]

The equation above for the total reactive gas flow rate to avoid cathode poisoning can be simplified into the following equation:

$$V_T=(V_{react})(1+Ex)$$

wherein $V_T$ is the total reactive gas flow rate; $V_{react}$ is the required volume of reactive gas per gram of target; and Ex is the percent of excess reactive gas depending on the system configuration.

Where EX is excess reactive gas [%] (typically 5 to 50% depending on configurations)

The equation for the total reactive gas flow rate to avoid cathode poisoning can be simplified into the following equation:

$$V_T=F_V \times \sigma \times m \times (1+Ex) \times P$$

wherein $V_T$ is the total reactive as flow rate; $F_V$=the volume factor dependent on chemical reaction; $\sigma$=the ratio of the reactive vs. nonreactive sputtering rates; m=the target sputtering rate per power; Ex=the percent of excess reactive gas depending on the system configuration; and P=pressure.

The total reactive gas flow rate, $V_T$, requires reactive gas supplies to avoid cathode and anode poisoning. The gas flow rate, $V_T$ also provides enough reactive gas to form full oxide or nitride without reactive gas vacancies in the deposited film.

Modification and variation can be made to the disclosed embodiments according to the present invention without departing from the scope of the invention as described. Those skilled in the art will appreciate that the applications of the present invention herein are varied, and that the invention is described in the preferred embodiment and the example. Accordingly, additions and modifications can be made without departing from the principles of the invention. Particularly with respect to the claims it should be understood that changes may be made without departing from the essence of this invention. In this regard, it is intended that such changes would still fall within the scope of the present invention. Therefore, this invention is not limited to the particular embodiments disclosed, but is intended to cover modifications within the spirit and scope of the present invention as defined in the appended claims.

What is claimed is:

1. A method of performing sputter deposition implemented using a microprocessor control module and based on time without the use of feedback loops, comprising:
    programming the microprocessor control module with pre-determined time sequences by using an object program using mathematical formulas to enhance and manage the operating parameters;
    positioning a substrate within a reaction chamber containing a metal target;
    generating a control signal based on the programmed pre-determined time sequences to evacuate ambient gas from the reaction chamber;
    filling the reaction chamber with inert gas using an inert gas controller;
    generating an electrical current flow at constant voltage across the metal target;
    generating a time-response gradient for initiating gas flow from a reactive gas supply by establishing a relationship between power level from a system power supply and time in order to initiate reactive gas flow according to the programmed pre-determined time sequences; and
    introducing a reactive gas to the reaction chamber based on the-programmed pre-determined time sequences without the use of feedback loops or parameter monitoring by periods using a reactive gas controller at a predetermined time in a sequence of operation of the inert gas controller and the system power supply whereby reactive gas flow rate to avoid cathode poisoning is calculated by equation $$V_T=(V_{react})(1+Ex)$$

wherein $V_T$ is the total reactive gas flow rate; $V_{react}$ is the required volume of reactive gas per gram of target; and Ex is the percent of excess reactive gas depending on a system configuration;
wherein the equation is programmed into the microprocessor control module.

2. A method for performing sputter deposition implemented using a microprocessor control module and based on time without the use of feedback loops, comprising:
    programming the microprocessor control module with pre-determined time sequences by using an object program using mathematical formulas to enhance and manage the operating parameters;
    positioning a substrate and a metal target within a reaction chamber;
    generating a control signal from a system controller based on the programmed pre-determined time sequences;
    evacuating ambient gas from the reaction chamber using a gas evacuator responsive to the system controller;
    filling the reaction chamber with non-reactive gas using a non-reactive gas controller responsive to the system controller;
    generating a current flow at constant voltage across the metal target from power supply responsive the system controller;
    generating a time-response gradient for initiating gas flow from a reactive gas supply by establishing a relationship between power level from a system power supply and time in order to initiate reactive gas flow according to the programmed pre-determined time sequences; and
    introducing a reactive gas to the reaction chamber based on the programmed pre-determined time sequences without the use of feedback loops or parameter monitoring using a reactive gas controller responsive to the system controller whereby the system controller is regulated by the object program using mathematical formulas to enhance the operating parameters and whereby reactive gas flow rate to avoid cathode poisoning is calculated by equation $$V_T=(V_{react})(1+Ex)$$

wherein $V_T$ is the total reactive gas flow rate; $V_{react}$ is the required volume of reactive gas per gram of target; and Ex is the percent of excess reactive gas depending on a system configuration;
wherein the equation is programmed into the microprocessor control module.

3. The method of performing sputter deposition of claim 2, wherein the system controller elicits responses from the gas evacuators, the non-reactive gas controllers, the power supplies and the reactive gas controllers based on programmed time sequences.

4. The method of claim 1, wherein the inert gas and reactive gas are supplied to the reaction chamber at the same flow rate.

5. The method of claim 1, wherein the inert gas is argon and the reactive gas is oxygen.

6. The method of claim 1 wherein consumption of the reactive gas is proportional to input power from the system power supply.

7. The method of claim 2 wherein consumption of the reactive gas is proportional to input power from the system power supply.

* * * * *